(12) United States Patent
Krishnamoorthy et al.

(10) Patent No.: US 9,628,053 B2
(45) Date of Patent: Apr. 18, 2017

(54) MULTI-LEVEL PULSE GENERATOR CIRCUITRY

(71) Applicant: International Rectifier Corporation, El Segundo, CA (US)

(72) Inventors: Aswath Krishnan Krishnamoorthy, Providence, RI (US); Anthony B. Candage, Meredith, NH (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/836,413

(22) Filed: Aug. 26, 2015

(65) Prior Publication Data

US 2016/0065187 A1    Mar. 3, 2016

Related U.S. Application Data

(60) Provisional application No. 62/045,134, filed on Sep. 3, 2014.

(51) Int. Cl.

| H03K 3/013 | (2006.01) |
|---|---|
| H03K 5/153 | (2006.01) |
| H03K 5/1532 | (2006.01) |
| H03K 3/356 | (2006.01) |
| H03K 5/003 | (2006.01) |
| H03K 19/00 | (2006.01) |
| H03K 19/003 | (2006.01) |

(52) U.S. Cl.
CPC ......... *H03K 3/013* (2013.01); *H03K 3/35613* (2013.01); *H03K 5/003* (2013.01); *H03K 5/1532* (2013.01); *H03K 19/0027* (2013.01); *H03K 19/00361* (2013.01)

(58) Field of Classification Search
CPC   H03K 3/00; H03K 3/01; H03K 3/013; H03K 3/02; H03K 3/64; H03K 3/78; H03K 5/003; H03K 5/13; H03K 5/131; H03K 5/153; H03K 5/1532
USPC ................ 327/178, 179, 291, 293, 294, 306
See application file for complete search history.

(56) References Cited

U.S. PATENT DOCUMENTS

| 5,101,116 A * | 3/1992 | Morokawa ............... G09G 3/30 327/108 |
| 6,404,274 B1 * | 6/2002 | Hosono ................. H02M 3/073 327/536 |

(Continued)

*Primary Examiner* — William Hernandez
(74) *Attorney, Agent, or Firm* — Chapin IP Law, LLC

(57) ABSTRACT

During operation, a supply voltage and the reference voltage power a novel multi-level pulse generator circuit. The multi-level pulse generator circuit generates voltage pulses of varying magnitude from a respective output port. For example, the multi-level pulse generator circuit produces respective pulses to have magnitudes that fall inside and outside of a range defined by the supply voltage and the reference voltage. Expansion of the pulse magnitudes to be outside of the range as defined by the supply voltage and the reference voltage increases noise immunity and therefore enables a respective transmitter to transmit data at higher bandwidth. The multi-level pulse generator circuit can be fabricated using a set of multiple transistors of only a single type in which each of the multiple transistors in the set has a corresponding oxide breakdown voltage that is substantially less than the respective magnitude that falls outside of the range.

22 Claims, 6 Drawing Sheets

(56) References Cited

U.S. PATENT DOCUMENTS

2005/0134250 A1* 6/2005 Kim .................. G11C 5/14
   323/299
2005/0254308 A1* 11/2005 Kook ................. G11C 5/145
   365/185.23

* cited by examiner

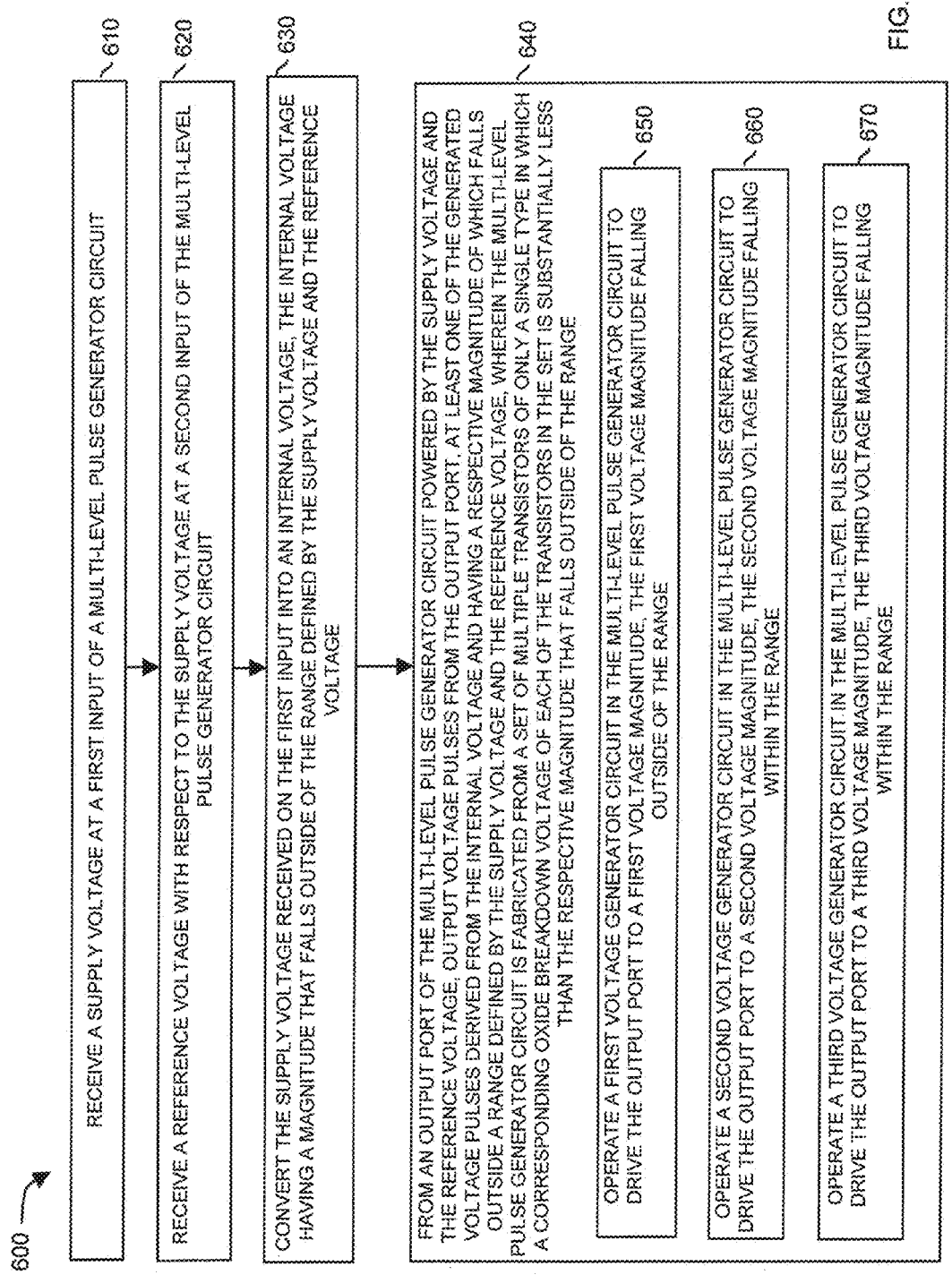

MULTI-LEVEL PULSE GENERATOR CIRCUITRY

RELATED APPLICATIONS

This application is related to and claims the benefit of earlier filed U.S. Provisional Patent Application Ser. No. 62/045,134 entitled "Multi-Level High Voltage Pulse Generator," filed on Sep. 3, 2014, the entire teachings of which are incorporated herein by this reference.

BACKGROUND

FIG. 1 is an example diagram of a conventional field effect transistor. Typically, the source node 120 and body node 125 of conventional field effect transistor 100 are connected to each other.

In general, application of a drive voltage to the gate node 110 of the field effect transistor 100 produces a channel 140 in the p-doped region underneath the oxide layer 145, resulting in a low impedance conduction path (short-circuit) between the source node 120 and the drain node 115. Conversely, when the voltage applied to the gate node 110 is substantially equal to the voltage applied to the body node 125, the source node 120 and the drain node 115 are electrically isolated (open circuit) from each other.

As is well known, conventional field effect transistors such as those in FIG. 1 have been used to design many different types of circuits. In certain instances, the conventional field effect transistors are used to fabricate communication circuits configured to convey data downstream to a target communication device.

BRIEF DESCRIPTION

In general, communications transmitted downstream to a target communication device become degraded along a respective signal path. Accordingly, it is sometimes essential to boost the signal levels up as high as possible at the source (i.e., the transmitter) to ensure that the received signal is of sufficient quality at a respective receiver.

As a result of shrinking field effect transistor sizes, the oxide breakdown voltage of respective devices scales proportionally, reducing the oxide breakdown voltage. Reducing the size of the field effect transistors (resulting in the reduced oxide breakdown voltage) therefore inherently limits the maximum voltage output levels of a respective circuit to be equivalent to the oxide breakdown voltage of the corresponding transistor technology. For example, if the oxide breakdown voltage is 2 V for a corresponding type of transistor technology, then a corresponding communication circuit is limited to producing an output range within 2 V. The oxide breakdown voltage may therefore severely limit the magnitude of output voltages within a very small range, which is detrimental to providing high-speed communications that require higher voltage swings.

In contrast to conventional control techniques, embodiments herein include an apparatus comprising: a first input to receive a supply voltage; a second input to receive a reference voltage with respect to the supply voltage, and a multi-level pulse generator circuit. During operation, the supply voltage and the reference voltage power the multi-level pulse generator circuit. The multi-level pulse generator circuit generates voltage pulses from a respective output port. One or more of the voltage pulses outputted from the multi-level pulse generator circuit has a respective magnitude of which falls outside a range defined by the supply voltage and the reference voltage. In addition to generating one or more pulses outside of the respective range defined by the supply voltage and the reference voltage, the multi-level pulse generator circuit further generates voltage pulses having magnitudes that fall within the range.

One use of the multi-level pulse generator circuit as described herein is to provide downstream communications to a target receiver circuit. Each of the outputted different magnitude pulses, whether generated within or outside of the range defined by the supply voltage and the reference voltage, conveys corresponding data. Expansion of the pulses to be outside of the range as defined by the supply voltage and the reference voltage enables a respective transmitter to transmit data at higher bandwidth.

Additionally, increasing the range of the output of the multi-level pulse generator circuit to be outside of the operating range as defined by the supply voltage and the reference voltage provides noise immunity with respect to a corresponding encoded signal. That is, because the multi-level pulse generator circuit enables transmission of pulses outside of the original limited voltage range, the multi-level pulse generator circuit transmits signals at higher levels of quality.

In one embodiment, the multi-level pulse generator circuit is fabricated using a set of multiple transistors of only a single type, in which each of the multiple transistors in the set having a corresponding oxide breakdown voltage that is substantially less than the respective magnitude that falls outside of the range.

As further described herein, a state of the output port can be monitored to protect corresponding transistors from being damaged. In one embodiment, the multi-level pulse generator circuit includes one or more peak detectors that monitor the state of the output port and apply an appropriate voltage to the body node of a transistor such that the transistor is not damaged.

By further way of non-limiting example, embodiments herein include a multi-level, high voltage pulse generator capable of transmitting output signals at magnitudes of at least twice the oxide breakdown voltage of the corresponding transistors used to fabricate the voltage pulse generator. As previously discussed, expanding the range of the output voltage to be greater than the oxide breakdown voltage enhances a signal amplitude and respective ability to communicate downstream.

These and other more specific embodiments are disclosed in more detail below.

It is to be understood that the system, method, apparatus, etc., as discussed herein can be embodied strictly as hardware, as a hybrid of software and hardware, or as software alone such as within a processor, or within an operating system or a within a software application. Example embodiments of the invention may be implemented within products and/or software applications such as those developed or manufactured by International Rectifier Corporation of El Segundo, Calif., USA.

Additionally, note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

FIG. 6 is an example diagram illustrating a method according to embodiments herein.

DETAILED DESCRIPTION

Embodiments herein include a novel multi-level pulse generator circuit. During operation, a supply voltage and corresponding reference voltage power the multi-level pulse generator circuit. The multi-level pulse generator circuit generates voltage pulses of varying magnitude from a respective output port. For example, the multi-level pulse generator circuit produces respective pulses to have magnitudes that fall inside a range defined by the supply voltage and the reference voltage.

In contrast to conventional circuitry, the multi-level pulse generator circuit also produces respective pulses to have magnitudes that fall outside a range defined by the supply voltage of the reference voltage. Expansion of the pulse magnitudes to be outside of the range as defined by the supply voltage and the reference voltage increases signal noise immunity and therefore enables a respective transmitter to transmit data in an output signal at a higher bandwidth.

As further described herein, the multi-level pulse generator circuit can be fabricated using a set of multiple transistors of only a single type in which each of the multiple transistors in the set has a corresponding oxide breakdown voltage that is substantially less than the respective magnitude that falls outside of the range.

Figure 2:
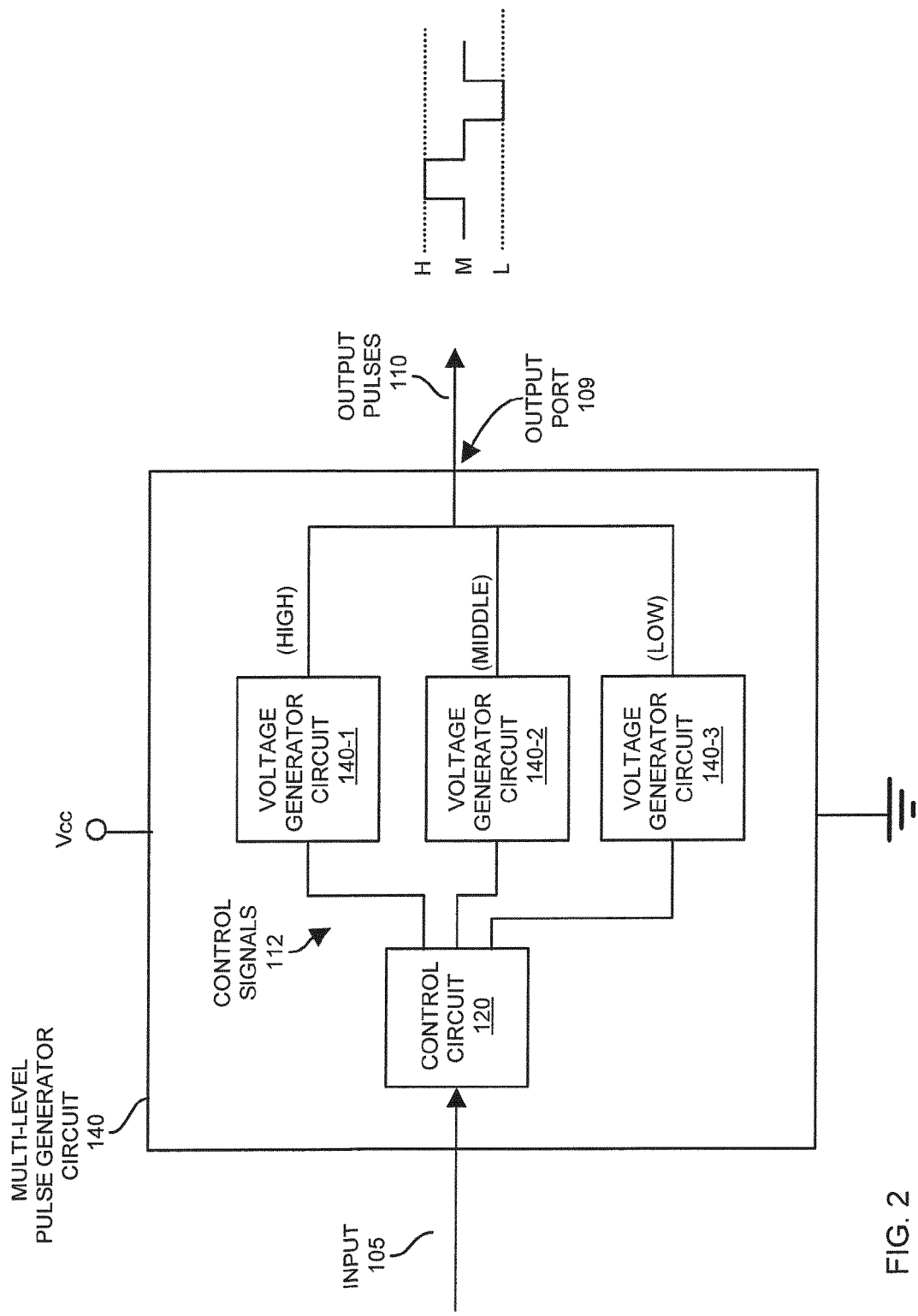
FIG. 2 is an example diagram illustrating a diagram of a multi-level pulse generator circuit according to embodiments herein.

Now, more specifically, FIG. 2 is an example diagram illustrating a diagram of a multi-level pulse generator circuit according to embodiments herein.

As shown, the multi-level pulse generator circuit 140 includes control circuit 120, voltage generator circuit 140-1, voltage generator circuit 140-2, and voltage generator circuit 140-3. During operation, the control circuit 120 receives input 105 such as a data or control signal. In one embodiment, input 105 indicates how to produce pulses at different voltage levels at different times.

As its name suggests, based upon input 105 indicating what the current output voltage level should be outputted from output port 109 of the multi-level pulse generator circuit 140, the control circuit 120 generates (internal) control signals 112. In general, as further discussed below, the control signals 112 control the corresponding states of the voltage generator circuit 140-1, voltage generator circuit 140-2, and voltage generator circuit 140-3.

According to yet further embodiments, as shown, outputs of each of the voltage generator circuits 140-1, 140-2, and 140-3 are electrically tied together and to the output port 109. Because simultaneous activation of two or more of the voltage generator circuits may cause damage on respective outputs, the control circuit 120 independently controls (via control signals 112) activation of the multiple voltage generator circuits at different times to drive different voltage pulses from the output port 109. In one embodiment, via generation of control signals 112, the control circuit 120 activates each of the different voltage generator circuits 140-1, 140-2, and 140-3 at different times such that they do not conflict with each other when generating respective output pulses 110 from output port 109.

For example, to generate a high-level voltage pulse (H) on the output port 109, during a first time duration, the control circuit 120 generates control signals to activate voltage generator circuit 140-1 and deactivate voltage generator circuit 140-2 and 140-3. In one embodiment, as will be discussed further in the specification, the high-level voltage pulse outputted on the output port 109 falls outside of a respective range defined by supply voltage VCC and ground.

During a second time duration, to generate a mid-level voltage pulse (M) on the output port 109, the control circuit 120 generates control signals 112 to activate voltage generator circuit 140-2 and simultaneously deactivate voltage generator circuit 140-1 and 140-3. In one embodiment, the mid-level voltage pulse outputted on the output port 109 falls within of a respective range defined by supply voltage VCC and ground.

During a third time duration, to generate a low-level voltage pulse (L) on the output port 109, the control circuit 120 generates control signals 112 to activate voltage generator circuit 140-3 and simultaneously deactivate voltage generator circuit 140-1 and 140-2. In one embodiment, the low-level voltage pulse outputted on the output port 109 falls within of a respective range defined by supply voltage VCC and ground.

Note that the multi-level pulse generator circuit 140 can be configured to include a number of voltage generator circuits to produce pulse outputs at any number of different levels.

As will be discussed later in this specification, in one embodiment, the multi-level pulse generator circuit 140 is fabricated using only a set of transistors (one or more N-FETs and one or more P-FETs), each of which has a corresponding gate-to-body oxide breakdown voltage that is substantially less (such as at least 10-25% less) than the maximum magnitude of high-voltage pulse (H).

Figure 3:
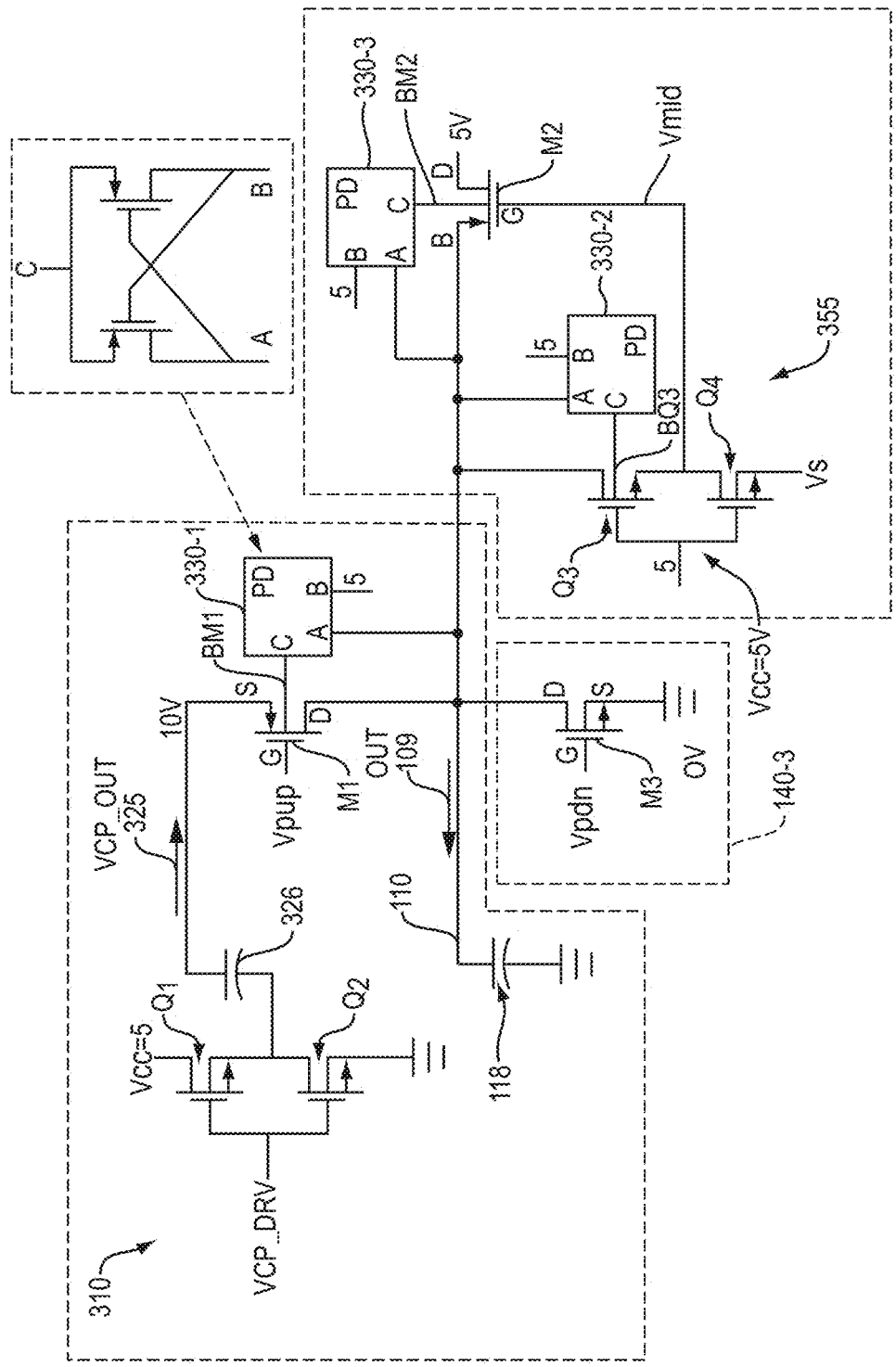
FIG. 3 is an example diagram illustrating an example internal circuit configuration of a multi-level pulse generator circuit according to embodiments herein.

FIG. 3 is an example diagram more specifically illustrating an example circuit configuration of a multi-level pulse generator circuit and corresponding internal circuit components according to embodiments herein.

Voltage Generator Circuit 140-1

As further shown in this example embodiment, the voltage generator circuit 140-1 includes voltage converter 310 including transistor Q1, transistor Q2, capacitor 325, transistor M1, and peak detector circuit 330-1.

Note that, in this example embodiment, the voltage converter 310 and corresponding capacitor 326 represent a charge pump to convert the supply voltage VCC (such as 5 V) into a corresponding high-voltage signal such as 10 V. Toggling of signal VCP_DRV activates the voltage converter 310 to an ON state. In such an instance, an output node of the capacitor 326 produces the internal voltage 325 (such as 10 V).

Instead of being a charge pump, note that a combination of the voltage converter circuit 310 and capacitor 325 can be any suitable type of resource having the ability to convert VCC into a respective higher voltage.

In one embodiment, the multi-level pulse generator circuit 140 activates the voltage converter circuit 310 to generate at least one voltage pulse that falls outside of the range defined by the supply voltage VCC and ground. That is, when at 10 V (or any other suitable voltage above VCC such as 6 Volts, 7 volts, etc.), the internal voltage 325 has a magnitude that falls outside of the range defined by the supply voltage, VCC, and the ground reference voltage.

Figure 1:
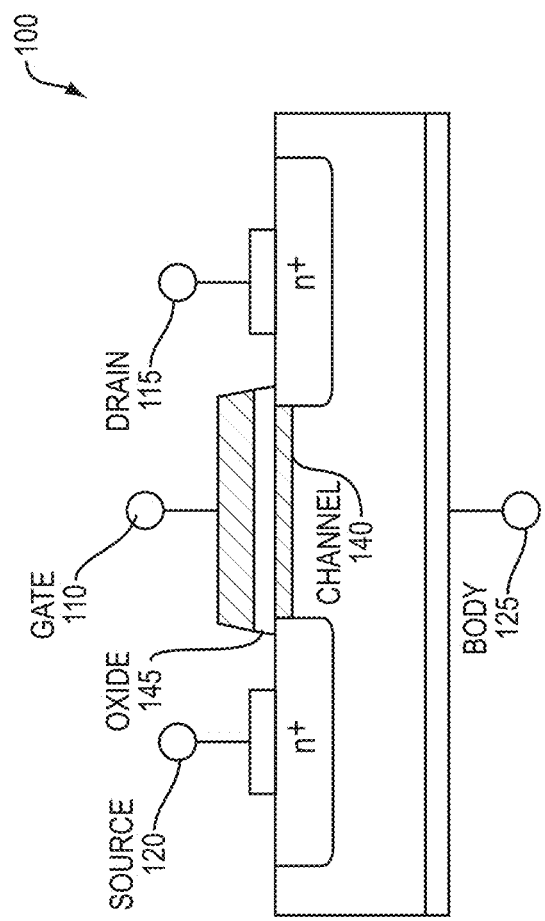
FIG. 1 is an example diagram of a conventional field effect transistor including a source node, gate node, drain node, and body node.

During operation, the control circuit 120 generates signal Vpup to control a state of transistor M1 (such as an N-type field effect transistor, and an example of which is shown in FIG. 1). Activation of the transistor M1 causes the internal voltage 325 to be conveyed to the output port 109 and applied to load 118.

Peak detector circuit 330-1 includes multiple transistors including Q5 and Q6. During operation, the peak detector circuit 330-1 receives the voltage applied to output port 109 on node A; node B of the of the peak detector circuit is connected to VCC or 5 V. The output node C of the peak detector 330-1 depends upon a setting of the output port 109.

In lieu of connecting the body node BM1 to the corresponding source node of transistor M1 as is normally the case for conventional circuits, embodiments herein include connecting the body node BM1 to output (node C) of the peak detector circuit 330-1. As further discussed below, the application of the output of the peak detector 330-1 to the body node BM1 of the transistor M1 prevents the transistor M1 (and corresponding oxide layer) from being damaged during operation.

For example, an output of the peak detector circuit 330-1 controls a voltage applied to the body node BM1 of the transistor M1 based at least in part on the voltage state of the output port 109. When the output is 10V, the peak detector circuit 330-1 applies 5 V to the body node BM1. The oxide breakdown voltage associated with transistor M1 may be around 5.5 V. Thus, use of the peak detector circuit 330-1 and application of 5 V (rather than 10 V) to the body node BM1 ensures that the corresponding oxide layer between the gate and the p-layer coupled to the body node BM1 is never greater than 5 V, thus preventing any damage to the oxide layer between the gate node and the body node BM1 of transistor M1.

Accordingly, when the transistor M1 is activated via the application of a voltage to the corresponding gate node via signal Vpup, transistor M1 turns ON conveying the internal voltage 325 (VCP_Out) such as 10 V to the output port 109 that drives corresponding load 118 (such as a capacitive load, resistive load, etc.). In such an instance, activation of transistor M1 (Vpup=5V, internal voltage 325=10 V) causes a high level (H) output pulse to be transmitted from the output port 109.

As previously discussed, while the control circuit 120 activates transistor M1 via application of an appropriate voltage level (such as 5V) to input Vpup, the control circuit 120 generates control signals 112 to maintain transistor M2 and transistor M3 in a respective OFF state. This prevents the different voltage generator circuits from being damaged.

Voltage Generator Circuit 140-2

As further shown, the signal Vmid applied to the gate of transistor M2 in combination with the node C output voltage of the peak detector 330-3 controls a state of transistor M2. As previously discussed, the control circuit 120 activates the transistor M2 in the voltage generator circuit 140-2 while transistor M1 and transistor M3 are both deactivated.

In one embodiment, the control circuit 120 controls voltage Vs applied to the source node of Q4 in inverter circuit 355 to produce the signal Vmid to the desired state. Peak detector circuit 330-3 includes node A to receive an input of VCC; the peak detector circuit 330-3 includes node B electrically coupled to the output port 109.

In general, as shown, the input of the inverter circuit 355 (e.g., the combination of transistor Q3 and transistor Q4) is set to VCC; the output node C of the peak detector circuit 330-2 applies a voltage to the body node BQ3 of transistor Q3. In a similar manner as previously discussed, the voltage of the output node C of the peak detector circuit 330-2 depends upon a state of the output port 109 inputted to node A of the peak detector circuit 330-2. As further shown, input node B of the peak detector circuit 330-2 is connected to VCC.

During operation, the peak detector circuit 330-2 prevents transistor Q3 from being damaged when the output port 109 is set to 10 V. For example, when the output port is set to 10 V (such as when transistor M1 is activated in a manner as previously discussed), the input node A of the peak detector circuit 330-2 is set to 10 V. In such an instance, transistor Q6 in the peak detector circuit 330-2 is activated to electrically couple VCC to the body node BQ3 of transistor Q3. This technique of controlling the voltage of body node BQ3 prevents the transistor Q3 from being damaged when the output port is set to 10 V.

Additionally, during operation, the peak detector circuit 330-3 prevents transistor M2 from being damaged when the output port is set to 10 V. For example, when the output port 109 is set to 10 V (such as when transistor M1 is activated in a manner as previously discussed), the input node A of the peak detector circuit 330-2 is set to 10 V; input node B of the peak detector circuit 330-3 is set to VCC=5. In such an instance, transistor Q6 in the peak detector circuit 330-2 is activated to electrically couple VCC to the body node BM2 of transistor M2. This technique of controlling the voltage of body node BM2 prevents the transistor M2 from being damaged when the output port is set to 10 V.

Voltage Generator Circuit 140-3

As further shown, the voltage generator circuit 140-3 includes transistor M3 (such as a P-type field effect transistor). While transistor M1 and M2 are set to an OFF state, the control circuit 120 selectively controls the signal Vpdn to a respective ON state in order to produce a low-voltage output (L) from output port 109. In other words, activation of the transistor M3 causes the voltage from the output port 109 to be pulled down to ground.

Figure 4:
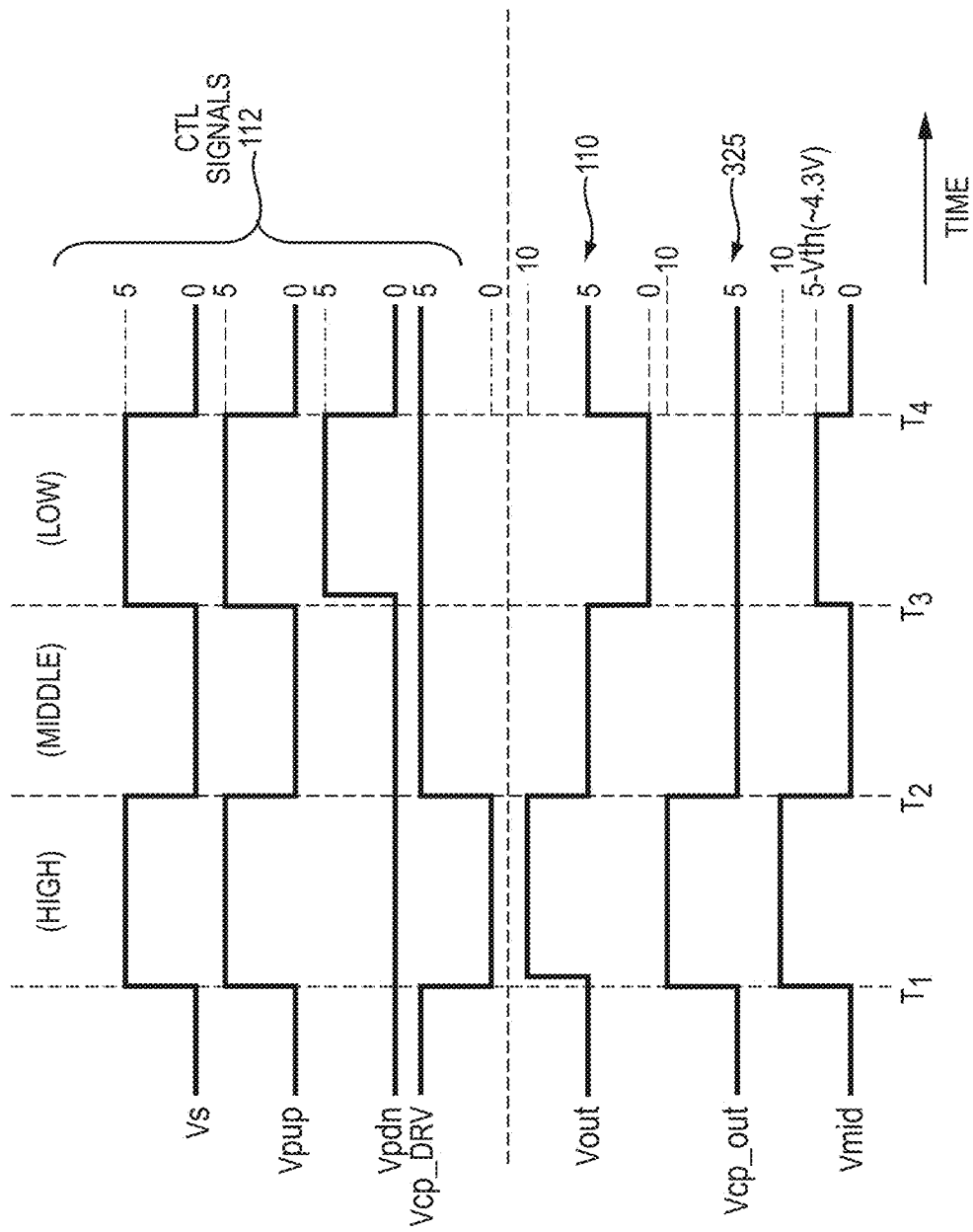
FIG. 4 is an example timing diagram illustrating different states of nodes in the multi-level pulse generator circuit according to embodiments herein.

FIG. 4 is an example timing diagram illustrating different states of nodes in the multi-level pulse generator circuit according to embodiments herein.

As shown and as previously discussed, the control circuit 120 of the multi-level pulse generator circuit 140 produces control signals 112 to generate output pulses 110 from the output port 109.

Specifically, between time T1 and T2, the control circuit 120 generates control signal Vs to be VCC=5 V; the control circuit 120 generates Vpup to be VCC=5 V; the control circuit 120 generates Vpdn to be GND=0 V; the control circuit 120 activates VCP_DRV=ON. Based on these settings, the voltage of output port 109 (VOUT) is set to 10 V; the signal Vmid is set to 10 V; activation of VCP_DRV=ON (activation of the voltage converter 310 via a sequence of pulses) results in VCP_OUT=10 V. In such an instance, between time T1 and T2, transistor M1 is activated while transistors M2 and M3 are deactivated.

Between time T2 and T3, the control circuit 120 generates control signal Vs to be GND=0 V; the control circuit 120 generates Vpup to be 0 V; the control circuit 120 generates Vpdn to be GND=0 V; the control circuit 120 deactivates VCP_DRV=OFF. In such an instance, based on these settings, the voltage of output port 109 (VOUT) is set to 5 V; the signal Vmid is set to 0 V; deactivation of VCP_DRV=OFF (deactivation of the voltage converter 310) results in VCP_OUT=5 V (due to back leakage of voltage from the output port 109 through the drain to source of transistor M1 to the output node of capacitor 325). This pre-charges the output node of the capacitor 325. In such an instance, between time T2 and T3, transistor M2 is activated while transistors M1 and M3 are deactivated.

Between time T3 and T4, the control circuit 120 generates control signal Vs to be VCC=5 V; the control circuit 120 generates Vpup to be 5 V; the control circuit 120 generates Vpdn to be VCC=5 V; the control circuit 120 activates VCP_DRV=OFF. In such an instance, based on these settings, the voltage of output port 109 (VOUT) is set to 0 V; the signal Vmid is set to 4.3 V; deactivation of VCP_DRV=ON (deactivation of the voltage converter 310) results in VCP_OUT=5 V (due to back leakage of voltage from the output port 109 through the drain to source of transistor M1 to the output node of capacitor 325). In such an instance, between time T3 and T4, transistor M3 is activated while transistors M1 and M2 are deactivated.

Figure 5:
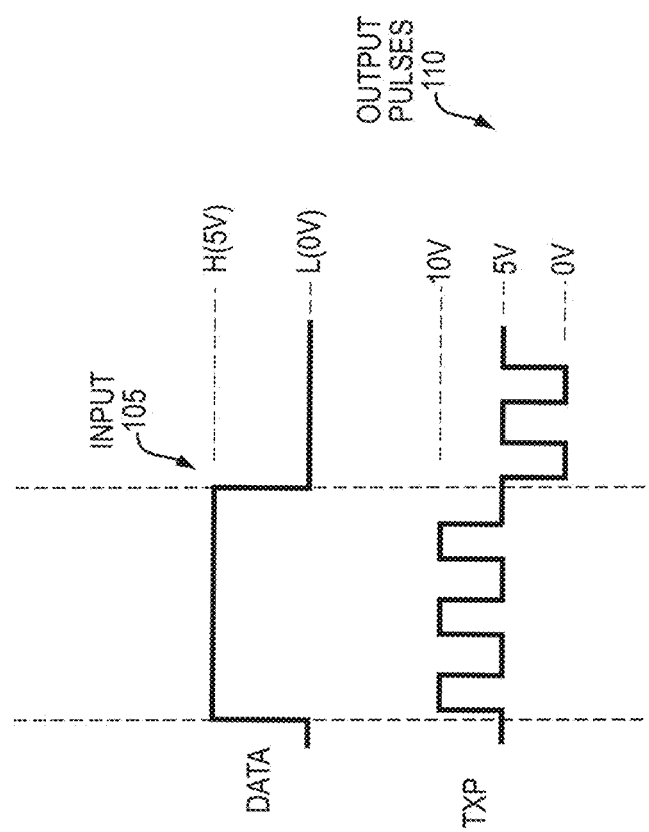
FIG. 5 is an example diagram illustrating use of the multi-level pulse generator circuit to generate a sequence of multiple pulses according to embodiments herein.

FIG. 5 is an example diagram illustrating use of the multi-level pulse generator circuit to generate a sequence of multiple pulses according to embodiments herein.

As shown, the multi-level pulse generator circuit 140 receives input 105 (such as of a control signal including data). Based upon the input 105, the control circuit 120 produces the control signals 112 to toggle between the middle state (M) and respective high state (H) to indicate that the input 105 is at a logic high level. Conversely, during times when the input 105 is a logic low, the control circuit 120 produces control signals 112 to toggle between the middle state (M) and respective low state (L) to indicate that the input 105 is a logic low level.

Note that the multi-level pulse generator circuit 140 can be duplicated to produce a differential output, details of which are described in related application entitled "Communication Over a Voltage Isolation Barrier," filed on the same day as the present application, the entire teachings of which are incorporated herein by this reference.

FIG. 6 is a flowchart 600 illustrating an example method of generating pulses using a multi-level pulse generator circuit according to embodiments herein. Note that there will be some overlap with respect to concepts as discussed above. Also, the steps can be executed in any suitable order.

In processing block 610, multi-level pulse generator circuit 140 receives a supply voltage (VCC such as 5 V) at a first power input.

In processing block 620, the multi-level pulse generator circuit 140 receives a reference voltage (such as ground or 0 V) with respect to the supply voltage VCC at a second input. The supply voltage VCC and corresponding reference ground power the multi-level pulse generator circuit 140.

In processing block 630, the voltage converter 310 converts the supply voltage VCC received on the first input into an internal voltage 325. The internal voltage 325 has a voltage magnitude that falls outside of the range (such as 0 to 5 V) defined by the supply voltage VCC in the ground reference voltage.

In processing block 640, the multi-level pulse generator circuit 140 outputs voltage pulses from a respective output port. In one embodiment, the multi-level pulse generator circuit 140 derives one or more of the outputted voltage pulses from the internal voltage 325. As previously discussed, a respective magnitude of such pulses fall outside a range (0 V to 5 V) defined by the supply voltage VCC and the ground reference voltage. Additionally, as previously discussed, the multi-level pulse generator circuit is fabricated from a set of multiple transistors of only a single type in which a respective oxide breakdown voltage of each of the transistors in the set is substantially less than the respective magnitude of pulses (such as 10 volt pulses) that fall outside of the range (such as in the 0 to 5 V range).

In sub-processing block 650, based on input 105 and corresponding control signals 112, the multi-level pulse generator circuit 140 operates (activates) first voltage generator circuit 140-1 to drive the output port 109 to a first voltage magnitude such as the internal voltage 325.

In sub-processing block 660, in accordance with input 105 and corresponding control signals 112, the multi-level pulse generator circuit 140 operates (activates) second voltage generator circuit 140-2 to drive the output port 109 to a second voltage magnitude (such as 4.3 V). The second voltage magnitude falling within the 0 to 5 V range.

In sub-processing block 670, then accordance with input 105 and corresponding control signals 112, the multi-pulse generator circuit 140 operates (activates) third voltage generator circuit 140-3 in the multi-level pulse generator circuit 140 to drive the output port 109 to a third voltage magnitude (such as a round 0 V). The third voltage magnitude falls within the 0 to 5 V range.

Note again that techniques herein are well suited for producing high voltage pulses using a low voltage power supply and a set of transistors having low oxide breakdown voltages. However, it should be noted that embodiments herein are not limited to such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. An apparatus comprising:
   a first input to receive a supply voltage;

a second input to receive a reference voltage with respect to the supply voltage;
a third input to receive a control signal;
an output port;
a multi-level pulse generator circuit, the multi-level pulse generator circuit powered by the supply voltage and the reference voltage, the multi-level pulse generator circuit operable to generate voltage pulses from the output port based on the control signal, at least one of the generated voltage pulses having a respective magnitude of which falls outside a range defined by the supply voltage and the reference voltage; and
control circuitry to receive the control signal, the control circuitry operable to drive different voltage pulses from the output port, the different voltage pulses including:
a first pulse substantially at a first voltage level as generated by a first voltage generator circuit of the multi-level pulse generator circuit;
a second pulse substantially at a second voltage level as generated by a second voltage generator circuit of the multi-level pulse generator circuit; and
a third pulse substantially at a third voltage level as generated by a third voltage generator circuit of the multi-level pulse generator circuit.

2. The apparatus as in claim 1, wherein the multi-level pulse generator circuit is fabricated using a set of multiple transistors of only a single type, each of the multiple transistors in the set having a corresponding oxide layer breakdown voltage that is substantially less than the respective magnitude that falls outside of the range.

3. The apparatus as in claim 2, wherein the multi-level pulse generator circuit includes a voltage level converter circuit that converts the supply voltage received on the first input into an internal voltage used by the multi-level pulse generator circuit to generate the at least one voltage pulse that falls outside of the range, the internal voltage having a magnitude that falls outside of the range defined by the supply voltage and the reference voltage.

4. The apparatus as in claim 1, wherein a magnitude of the first pulse falls outside of the range;
wherein a magnitude of the second pulse falls within the range; and
wherein a magnitude of the third pulse falls within the range.

5. The apparatus as in claim 1 further comprising:
a voltage converter circuit, the voltage converter circuit converting the supply voltage into an internal voltage having a magnitude that falls substantially outside of the range; and
a field effect transistor that selectively couples the internal voltage to the output port.

6. The apparatus as in claim 5, wherein the voltage converter circuit includes a capacitor, an output node of the capacitor producing the internal voltage; and
wherein the field effect transistor conveys voltage from the output port to the output node of the capacitor when the voltage converter circuit is deactivated.

7. An apparatus comprising:
a first input to receive a supply voltage;
a second input to receive a reference voltage with respect to the supply voltage;
a third input to receive a control signal;
an output port; and
a multi-level pulse generator circuit, the multi-level pulse generator circuit powered by the supply voltage and the reference voltage, the multi-level pulse generator circuit operable to generate voltage pulses from the output port based on the control signal, at least one of the generated voltage pulses having a respective magnitude of which falls outside a range defined by the supply voltage and the reference voltage; and
wherein the multi-level pulse generator circuit includes:
a field effect transistor, a body node of the field effect transistor controlled based at least in part upon a voltage state of the output port, the field effect transistor receiving an internal voltage generated by a voltage generator circuit, the field effect transistor electrically coupling the internal voltage to the output port to produce a voltage pulse falling outside of the range.

8. The apparatus as in claim 7 further comprising:
a peak detector circuit, an output of the peak detector circuit controlling a voltage applied to the body node of the field effect transistor based at least in part on the voltage state of the output port.

9. An apparatus comprising:
a first input to receive a supply voltage;
a second input to receive a reference voltage with respect to the supply voltage;
a third input to receive a control signal;
an output port;
a multi-level pulse generator circuit, the multi-level pulse generator circuit powered by the supply voltage and the reference voltage, the multi-level pulse generator circuit operable to generate voltage pulses from the output port based on the control signal, at least one of the generated voltage pulses having a respective magnitude of which falls outside a range defined by the supply voltage and the reference voltage; and
wherein the multi-level pulse generator circuit includes:
a first field effect transistor, a control voltage applied to a body node of the first field effect transistor controlled based at least in part upon a voltage state of the output port, the first field effect transistor electrically coupling the supply voltage to the output port to produce a voltage pulse falling within the range.

10. The apparatus as in claim 9 further comprising:
an inverter circuit, the inverter circuit outputting a control signal to a gate node of the first field effect transistor; and
a control circuit that controls a voltage setting of a source node of a second field effect transistor, the second field effect transistor disposed in the inverter circuit, the voltage setting of the source node controlling an output state of the control voltage applied to the gate node of the first field effect transistor.

11. The apparatus as in claim 9 further comprising:
a peak detector circuit, the input of the peak detector circuit coupled to the output port, an output of the peak detector circuit producing the control voltage applied to the body node of a field effect transistor based at least in part on a voltage state of the output port.

12. An apparatus comprising:
a first input to receive a supply voltage;
a second input to receive a reference voltage with respect to the supply voltage;
a third input to receive a control signal;
an output port;
a multi-level pulse generator circuit, the multi-level pulse generator circuit powered by the supply voltage and the reference voltage, the multi-level pulse generator circuit operable to generate voltage pulses from the output port based on the control signal, at least one of the generated voltage pulses having a respective magnitude of which falls outside a range defined by the supply voltage and the reference voltage; and wherein the multi-level pulse generator circuit includes:
a first field effect transistor, a respective voltage applied to a body node of the first field effect transistor controlled based at least in part upon a voltage state of the output port, the first field effect transistor electrically coupling a received voltage to the output port to produce a first voltage pulse falling outside of the range; and a second field effect transistor, a body node of the second field effect transistor controlled based at least in part upon a voltage state of the output port, the second field effect transistor electrically coupling the supply voltage to the output port to produce a second voltage pulse falling within the range.

13. An apparatus comprising:
a first input to receive a supply voltage;
a second input to receive a reference voltage with respect to the supply voltage;
a third input to receive a control signal;
an output port;
a multi-level pulse generator circuit, the multi-level pulse generator circuit powered by the supply voltage and the reference voltage, the multi-level pulse generator circuit operable to generate voltage pulses from the output port based on the control signal, at least one of the generated voltage pulses having a respective magnitude of which falls outside a range defined by the supply voltage and the reference voltage;
wherein the multi-level pulse generator circuit includes a voltage level converter circuit that converts the supply voltage received on the first input into an internal voltage used by the multi-level pulse generator circuit to generate the at least one voltage pulse that falls outside of the range, the internal voltage having a magnitude that falls outside of the range defined by the supply voltage and the reference voltage.

14. An apparatus comprising:
a first input to receive a supply voltage;
a second input to receive a reference voltage with respect to the supply voltage;
a third input to receive a control signal;
an output port;
a multi-level pulse generator circuit, the multi-level pulse generator circuit powered by the supply voltage and the reference voltage, the multi-level pulse generator circuit operable to generate voltage pulses from the output port based on the control signal, at least one of the generated voltage pulses having a respective magnitude of which falls outside a range defined by the supply voltage and the reference voltage;
wherein the control signal toggles between a first state and a second state;
wherein the multi-level pulse generator circuit is operable to toggle the output between a low level output voltage level and a middle level output voltage level during conditions in which the control input is set to the first state; and
wherein the multi-level pulse generator circuit is operable to toggle the output between the middle level output voltage level and a high level output voltage level during conditions in which the control input is set to the second state, a magnitude of the middle level voltage falling between the low level voltage and the high level voltage.

15. The apparatus as in claim 14, wherein a magnitude of the high level output voltage falls outside the range.

16. A method comprising:
receiving a supply voltage at a first input of a multi-level pulse generator circuit;
receiving a reference voltage with respect to the supply voltage at a second input of the multi-level pulse generator circuit;
converting the supply voltage into an internal voltage having a respective magnitude that falls substantially outside of a range defined by the supply voltage and the reference voltage;
receiving a control signal at a third input of the multi-level pulse generator circuit;
from an output port of the multi-level pulse generator circuit powered by the supply voltage and the reference voltage, outputting voltage pulses from the output port as indicated by the control signal, at least one of the generated voltage pulses being of the respective magnitude that falls substantially outside the range defined by the supply voltage and the reference voltage; and
selectively coupling the internal voltage to the output port.

17. The method as in claim 16, wherein the multi-level pulse generator circuit is fabricated from a set of multiple transistors of only a single type in which a corresponding oxide breakdown voltage of each of the transistors in the set is substantially less than the respective magnitude that falls outside of the range.

18. The method as in claim 16 further comprising:
controlling a first voltage generator circuit in the multi-level pulse generator circuit to drive the output port to a first voltage magnitude, the first voltage magnitude being the respective magnitude and falling outside of the range;
controlling a second voltage generator circuit in the multi-level pulse generator circuit to drive the output port to a second voltage magnitude, the second voltage magnitude falling within the range; and
controlling a third voltage generator circuit in the multi-level pulse generator circuit to drive the output port to a third voltage magnitude, the third voltage magnitude falling within the range.

19. The method as in claim 18 further comprising:
independently controlling activation of the multiple voltage generator circuits at different times to drive different voltage pulses from the output port, the different voltage pulses including:
a first pulse substantially at the first voltage magnitude as generated by the first voltage generator circuit;
a second pulse substantially at the second voltage magnitude as generated by the second voltage generator circuit; and
a third pulse substantially at the third voltage magnitude as generated by the third voltage generator circuit.

20. The method as in claim 16 further comprising:
applying a voltage to a body node of a field effect transistor, the applied voltage derived based at least in part upon a voltage state of the output port; and
utilizing the field effect transistor to electrically couple a received voltage to the output port.

21. The method as in claim 20 further comprising:
implementing a peak detector circuit to produce a voltage applied to the body node of the field effect transistor, the voltage applied to the body node derived at least in part based on the voltage state of the output port.

22. The apparatus as in claim 21 further comprising:
via an inverter circuit, outputting a control signal to a gate node of the field effect transistor; and
via a control circuit, controlling a voltage setting of a source node of a field effect transistor in the inverter circuit, the voltage setting of the source node controlling an output state of the control signal applied to the gate node of the field effect transistor.

* * * * *